United States Patent
Hirai et al.

(10) Patent No.: US 11,405,001 B2
(45) Date of Patent: Aug. 2, 2022

(54) IMAGE REJECTION MIXER AND COMMUNICATION CIRCUIT

(71) Applicant: Mitsubishi Electric Corporation, Tokyo (JP)

(72) Inventors: Akihito Hirai, Tokyo (JP); Mitsuhiro Shimozawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/995,352

(22) Filed: Aug. 17, 2020

(65) Prior Publication Data

US 2020/0382059 A1 Dec. 3, 2020

Related U.S. Application Data

(63) Continuation of application No. PCT/JP2018/008809, filed on Mar. 7, 2018.

(51) Int. Cl.
*H03D 7/14* (2006.01)
*H03K 5/00* (2006.01)

(52) U.S. Cl.
CPC ............. *H03D 7/1458* (2013.01); *H03D 7/14* (2013.01); *H03K 5/00* (2013.01); *H03K 2005/00078* (2013.01)

(58) Field of Classification Search
CPC ...... H03D 7/14; H03D 7/1425; H03D 7/1433; H03D 7/1441; H03D 7/145; H03D 7/1458; H03D 7/1466; H03D 7/1475; H03D 7/1483; H03D 7/1491; H03K 2005/00078; H03K 2005/00052
See application file for complete search history.

(56) References Cited

U.S. PATENT DOCUMENTS 9,722,591 B2 * 8/2017 Shimura .................. H03K 5/26
9,859,881 B2 * 1/2018 Shimura .................. H03K 5/26

FOREIGN PATENT DOCUMENTS

JP 2007-295419 A 11/2007
JP 2013-165335 A 8/2013

OTHER PUBLICATIONS

Hirai el al., "Image Rejection Mixer using Tunable Poly Phase Filter with Negative Feedback Control and Reference Resistor," Asia-Pacific Microwave Conference, 2016, 4 pages.
International Search Report (PCT/ISA/210) issued in PCT/JP2018/008809, dated May 29. 2018.

* cited by examiner

*Primary Examiner* — Long Nguyen
(74) *Attorney, Agent, or Firm* — Birch, Stewart, Kolasch & Birch, LLP (57) ABSTRACT

An image rejection mixer includes a delay circuit for delaying one of first signals divided by a distribution circuit and a second signal provided to a second mixing circuit by the same delay amount d, or delaying the other one of the first signals divided by the distribution circuit and the second signal provided to a first mixing circuit by the same delay amount d.

1 Claim, 9 Drawing Sheets

IMAGE REJECTION MIXER AND COMMUNICATION CIRCUIT

CROSS REFERENCE TO RELATED APPLICATIONS

This application is a Continuation of PCT International Application No. PCT/JP2018/008809, filed on Mar. 7, 2018, all of which is hereby expressly incorporated by reference into the present application.

TECHNICAL FIELD

The present invention relates to an image rejection mixer including first and second mixing circuits, and a communication circuit including an image rejection mixer.

BACKGROUND ART

In some cases, a communication circuit includes a mixer for converting the frequency of a high frequency signal.

The mixer converts the frequency of the high frequency signal by multiplying the high frequency signal by a local signal.

The mixer outputs a sum frequency component of the frequency of the high frequency signal and the frequency of the local signal, and a difference frequency component between the frequency of the high frequency signal and the frequency of the local signal.

At this point, a circuit subsequent to the mixer uses one of the sum frequency component and the difference frequency component as a desired signal.

Therefore, the communication circuit needs to mount a filter or the like that suppresses the frequency component that is not used as the desired signal among the sum frequency component and the difference frequency component.

Non-Patent Literature 1 listed below discloses an image rejection mixer including a 90-degree phase shifter.

The image rejection mixer disclosed in Non-Patent Literature 1 is capable of suppressing a frequency component that is not used as a desired signal without using a filter or the like.

CITATION LIST

Non-Patent Literature

Non-Patent Literature 1: Image Rejection Mixer using Tunable Poly Phase Filter with Negative Feedback Control and Reference Resistor

SUMMARY OF INVENTION

Technical Problem

The conventional image rejection mixer can suppress one of frequency components that is not used as a desired signal if the 90-degree phase shifter can shift the phase of the high frequency signal by exactly 90 degrees.

However, the conventional image rejection mixer has a disadvantage that it becomes impossible to suppress the frequency component that is not used as the desired signal if the phase shift amount of the high frequency signal in the 90-degree phase shifter deviates from 90 degrees.

The present invention has been made to solve the above-described disadvantage, and an object of the invention is to obtain an image rejection mixer capable of suppressing frequency components other than a desired signal.

Another object of the present invention is to obtain a communication circuit including an image rejection mixer capable of suppressing frequency components other than a desired signal.

Solution to Problem

An image rejection mixer according to the present invention includes: a differential distribution circuit dividing a first signal into two first signals; a first differential mixing circuit mixing one of the first signals divided by the differential distribution circuit and one of second signals and outputting third differential signals indicating a result of mixing the one of the first signals and the one of the second signals; a second differential mixing circuit mixing another one of the first signals divided by the differential distribution circuit and another one of the second signals and outputting fourth differential signals indicating a result of mixing the other one of the first signals and the other one of the second signals; a combining circuit combining a third signal among the third differential signals output by the first differential mixing circuit and a fourth signal among the fourth differential signals output by the second differential mixing circuit, the third signal and the fourth signal having signs opposite to each other, respectively; and a delay circuit delaying the one of the first signals divided by the differential distribution circuit and the other one of the second signals provided to the second differential mixing circuit by a same delay amount, or delaying the other one of the first signals divided by the differential distribution circuit and the one of the second signals provided to the first differential mixing circuit by a same delay amount.

Advantageous Effects of Invention

According to the present invention, the image rejection mixer is configured to include the delay circuit delaying the one of the first signals divided by the differential distribution circuit and the other one of the second signals provided to the second differential mixing circuit by the same delay amount, or delaying the other one of the first signals divided by the differential distribution circuit and the one of the second signals provided to the first differential mixing circuit by the same delay amount. Therefore, the image rejection mixer according to the present invention can suppress frequency components other than a desired signal.

DESCRIPTION OF EMBODIMENTS

To describe the present invention further in detail, embodiments for carrying out the present invention will be described below with reference to the accompanying drawings.

First Embodiment

Figure 1:
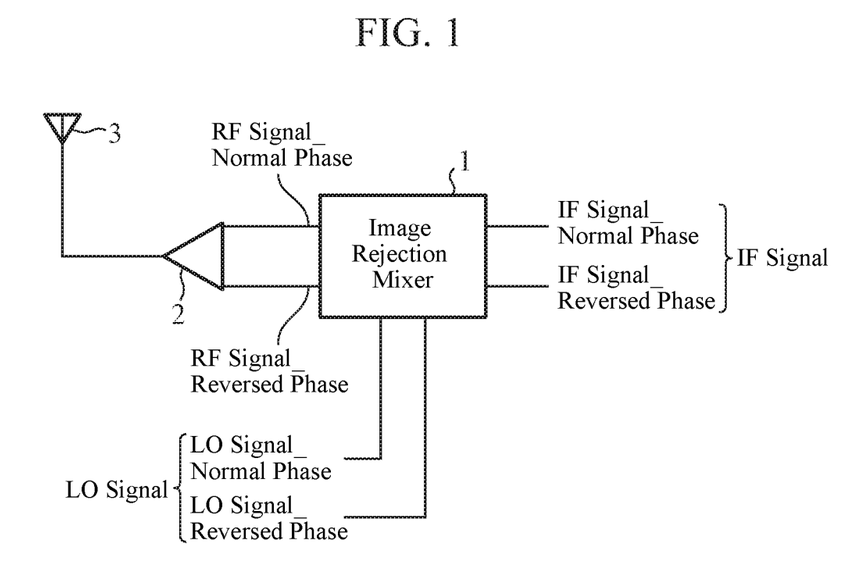
FIG. 1 is a configuration diagram illustrating a communication circuit including an image rejection mixer 1 according to a first embodiment.

FIG. 1 is a configuration diagram illustrating a communication circuit including an image rejection mixer 1 according to a first embodiment.

In FIG. 1, the image rejection mixer 1 receives input of, for example, an intermediate frequency (IF) signal as a first signal and a local oscillator (LO) signal as a second signal.

The image rejection mixer 1 mixes the IF signal and the LO signal, and outputs a radio frequency (RF) signal indicating a result of mixing the IF signal and the LO signal to an amplifier 2.

An IF signal is a differential signal including a normal-phase IF signal (hereinafter referred to as "IF signal_normal phase") and a reversed-phase IF signal (hereinafter referred to as "IF signal_reversed phase").

An LO signal is a differential signal including a normal-phase LO signal (hereinafter referred to as "LO signal_normal phase") and a reversed-phase LO signal (hereinafter referred to as "LO signal_reversed phase").

An RF signal is a differential signal including a normal-phase RF signal (hereinafter referred to as "RF signal_normal phase") and a reversed-phase RF signal (hereinafter referred to as "RF signal_reversed phase").

The amplifier 2 amplifies the RF signal output from the image rejection mixer 1 and outputs the amplified RF signal to an antenna 3.

The antenna 3 radiates the RF signal output from the amplifier 2 to space.

An example is illustrated herein in which a communication circuit is used as a transmitter; however, the communication circuit may be used as a receiver.

In a case where the communication circuit is used as a receiver, the image rejection mixer 1 receives an RF signal as a first signal.

In addition, in a case where the communication circuit is used as a receiver, the left side and the right side of the amplifier 2 illustrated in FIG. 1 are reversed to each other.

Figure 2:
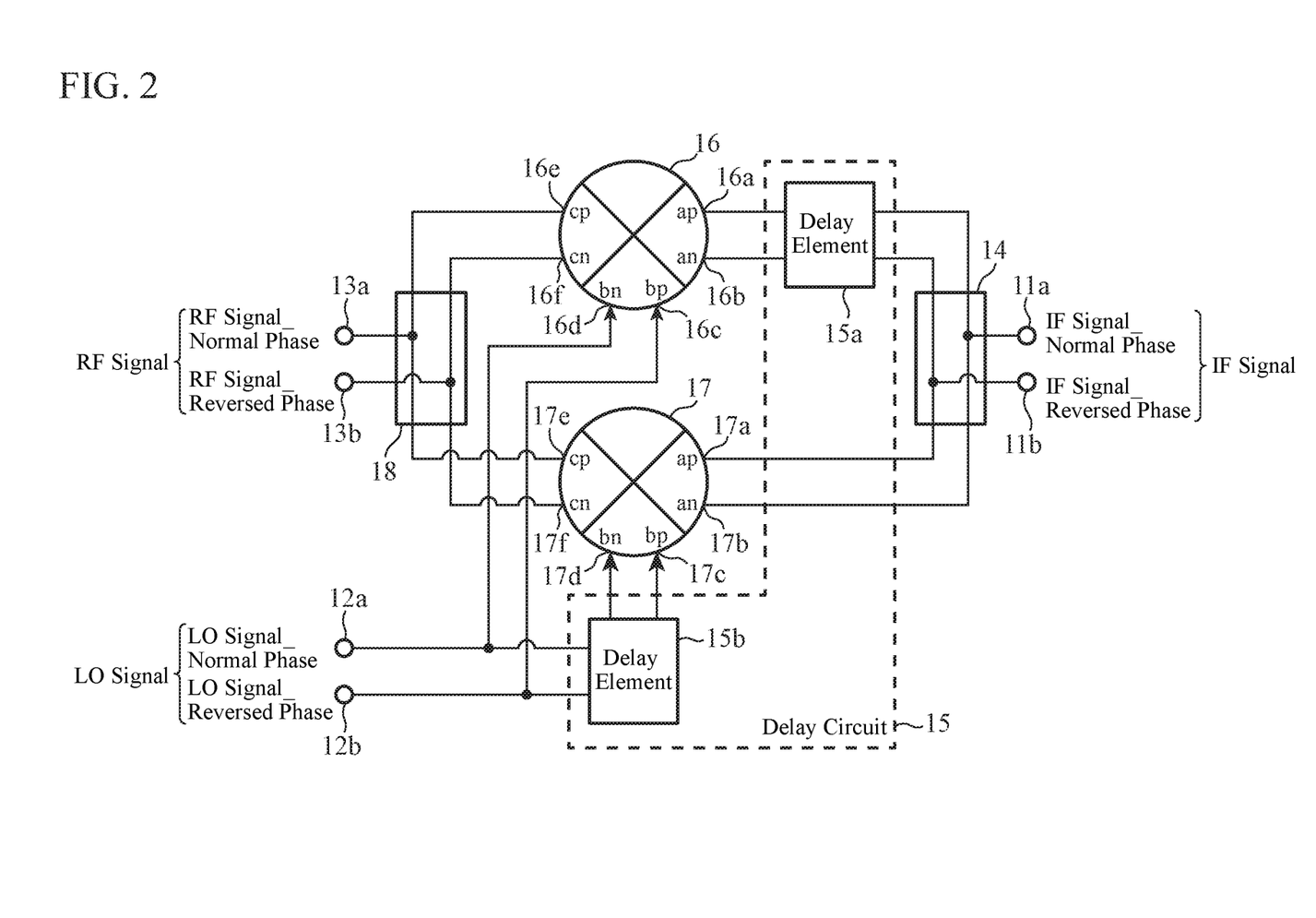
FIG. 2 is a configuration diagram illustrating the image rejection mixer 1 according to the first embodiment.

FIG. 2 is a configuration diagram illustrating the image rejection mixer 1 according to the first embodiment.

In the image rejection mixer 1 according to the first embodiment, an example is described in which each of the IF signal_normal phase and the IF signal_reversed phase is input as the first signal.

In FIG. 2, an IF input/output terminal 11a is a terminal for inputting/outputting an IF signal_normal phase.

An IF input/output terminal 11b is a terminal for inputting/outputting an IF signal_reversed phase.

An LO input terminal 12a is a terminal for inputting an LO signal_normal phase.

An LO input terminal 12b is a terminal for inputting an LO signal_reversed phase.

An RF input/output terminal 13a is a terminal for inputting/outputting an RF signal_normal phase.

An RF input/output terminal 13b is a terminal for inputting/outputting an RF signal_reversed phase.

When an IF signal_normal phase is input from the IF input/output terminal 11a, a distribution circuit 14 divides the IF signal_normal phase into two, and outputs one of the two IF signals_normal phase to a delay element 15a and the other IF signal_normal phase to an an terminal 17b of a second mixing circuit 17.

When an IF signal_reversed phase is input from the IF input/output terminal 11b, the distribution circuit 14 divides the IF signal_reversed phase into two, and outputs one of the two IF signals_reversed phase to the delay element 15a and the other IF signal_reversed phase to an ap terminal 17a of the second mixing circuit 17.

A delay circuit 15 includes the delay element 15a and a delay element 15b.

The delay element 15a delays the one IF signal_normal phase output from the distribution circuit 14 by a delay amount d, and outputs the delayed IF signal_normal phase to an ap terminal 16a of the first mixing circuit 16.

The delay element 15a delays the one IF signal_reversed phase output from the distribution circuit 14 by the delay amount d, and outputs the delayed IF signal_reversed phase to an an terminal 16b of the first mixing circuit 16.

When an LO signal_normal phase is input from the LO input terminal 12a, the delay element 15b delays the LO signal_normal phase by the delay amount d, and outputs the delayed LO signal_normal phase to a bn terminal 17d of the second mixing circuit 17.

When an LO signal_reversed phase is input from the LO input terminal 12b, the delay element 15b delays the LO signal_reversed phase by the delay amount d, and outputs the delayed LO signal_reversed phase to a bp terminal 17c of the second mixing circuit 17.

Note that the delay amount d in the delay element 15a is the same as the delay amount d in the delay element 15b.

The first mixing circuit 16 is a Gilbert cell and includes the ap terminal 16a, the an terminal 16b, a bp terminal 16c, a bn terminal 16d, a cp terminal 16e, and a cn terminal 16f.

The first mixing circuit 16 receives the IF signal_normal phase from the ap terminal 16a as a first signal and the IF signal_reversed phase from the an terminal 16b as the first signal.

The first mixing circuit 16 also receives an LO signal_normal phase from the bn terminal 16d as a second signal, and receives an LO signal_reversed phase from the bp terminal 16c as the second signal.

The first mixing circuit 16 mixes the first signal and the second signal, and outputs a third signal which is a result of mixing the first signal and the second signal to a combining circuit 18.

The first mixing circuit 16 outputs an RF signal_normal phase from the cp terminal 16e to the combining circuit 18 as a third signal, and outputs an RF signal_reversed phase from the cn terminal 16f to the combining circuit 18 as the third signal.

The second mixing circuit 17 is a Gilbert cell and includes the ap terminal 17a, the an terminal 17b, the bp terminal 17c, the bn terminal 17d, a cp terminal 17e, and a cn terminal 17f.

The second mixing circuit 17 receives the IF signal_normal phase from the an terminal 17b as the first signal and the IF signal_reversed phase from the ap terminal 17a as the first signal.

The second mixing circuit 17 also receives the LO signal_normal phase from the bn terminal 17d as the second signal and the LO signal_reversed phase from the bp terminal 17c as the second signal.

The second mixing circuit 17 mixes the first signal and the second signal, and outputs a fourth signal which is a result of mixing the first signal and the second signal to the combining circuit 18.

The second mixing circuit 17 outputs the RF signal_normal phase from the cp terminal 17e to the combining circuit 18 as the fourth signal, and outputs the RF signal_reversed phase from the cn terminal 17f to the combining circuit 18 as the fourth signal.

The combining circuit 18 combines the RF signal_normal phase output from the first mixing circuit 16 and the RF signal_normal phase output from the second mixing circuit 17, and outputs the combined RF signal_normal phase to the RF input/output terminal 13a.

The combining circuit 18 combines the RF signal_reversed phase output from the first mixing circuit 16 and the RF signal_reversed phase output from the second mixing circuit 17, and outputs the combined RF signal_reversed phase to the RF input/output terminal 13b.

Note that each of the distribution circuit 14, the delay circuit 15, the first mixing circuit 16, the second mixing circuit 17, and the combining circuit 18 included in the image rejection mixer 1 has a differential configuration.

Figure 3A:
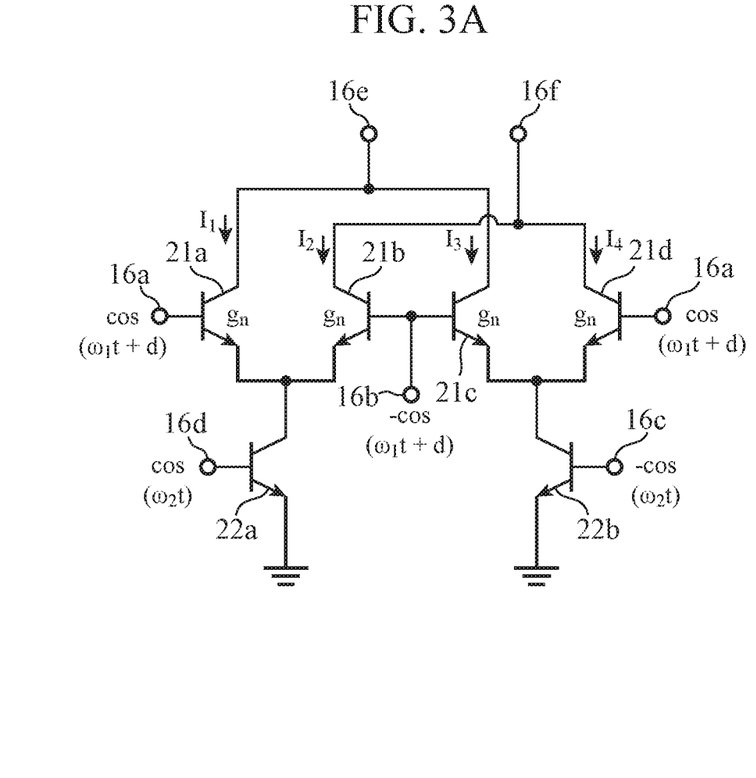
FIG. 3A is a configuration diagram illustrating a first mixing circuit 16 in a case where the first mixing circuit 16 is a Gilbert cell.

FIG. 3A is a configuration diagram illustrating the first mixing circuit 16 in a case where the first mixing circuit 16 is a Gilbert cell.

In FIG. 3A, the first mixing circuit 16 includes transistors 21a to 21d and transistors 22a and 22b.

In the transistor 21a, a base terminal is connected to the ap terminal 16a, a collector terminal is connected to the cp terminal 16e, and an emitter terminal is connected to a collector terminal of the transistor 22a.

In the transistor 21b, a base terminal is connected to the an terminal 16b, a collector terminal is connected to the cn terminal 16f, and an emitter terminal is connected to the collector terminal of the transistor 22a.

In the transistor 21c, a base terminal is connected to the an terminal 16b, a collector terminal is connected to the cp terminal 16e, and an emitter terminal is connected to a collector terminal of the transistor 22b.

In the transistor 21d, a base terminal is connected to the ap terminal 16a, a collector terminal is connected to the cn terminal 16f, and an emitter terminal is connected to the collector terminal of the transistor 22b.

In the transistor 22a, a base terminal is connected to the bn terminal 16d, the collector terminal is connected to the emitter terminals of the transistors 21a and 21b, and an emitter terminal is grounded.

In the transistor 22b, a base terminal is connected to the bp terminal 16c, the collector terminal is connected to the emitter terminals of the transistors 21c and 21d, and an emitter terminal is grounded.

Figure 3B:
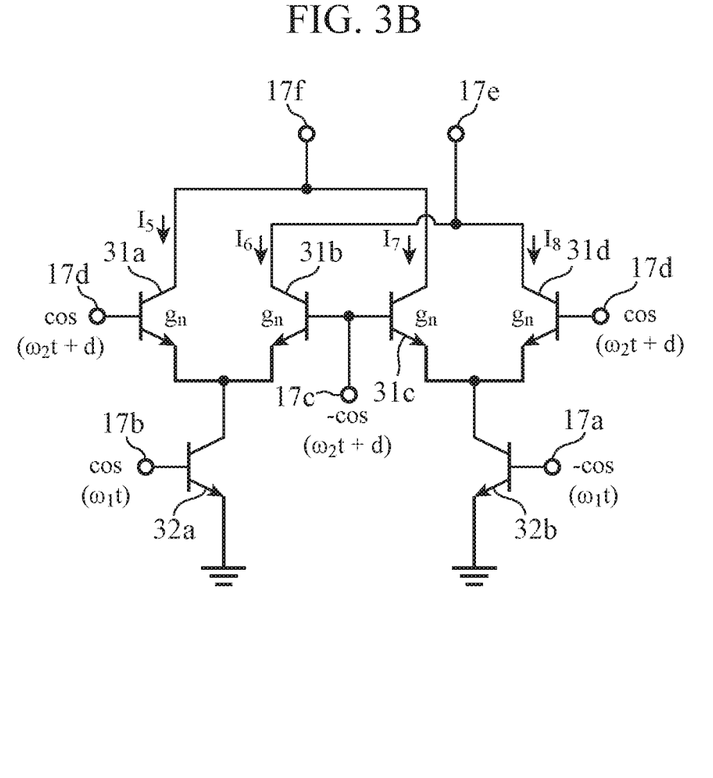
FIG. 3B is a configuration diagram illustrating a second mixing circuit 17 in a case where the second mixing circuit 17 is a Gilbert cell.

FIG. 3B is a configuration diagram illustrating the second mixing circuit 17 in a case where the second mixing circuit 17 is a Gilbert cell.

In FIG. 3B, the second mixing circuit 17 includes transistors 31a to 31d and transistors 32a and 32b.

In the transistor 31a, a base terminal is connected to the bn terminal 17d, a collector terminal is connected to the cn terminal 17f, and an emitter terminal is connected to a collector terminal of the transistor 32a.

In the transistor 31b, a base terminal is connected to the bp terminal 17c, a collector terminal is connected to the cp terminal 17e, and an emitter terminal connected to the collector terminal of the transistor 32a.

In the transistor 31c, a base terminal is connected to the bp terminal 17c, a collector terminal is connected to the cn terminal 17f, and an emitter terminal is connected to a collector terminal of the transistor 32b.

In the transistor 31d, a base terminal is connected to the bn terminal 17d, a collector terminal is connected to the cp terminal 17e, and an emitter terminal is connected to the collector terminal of the transistor 32b.

In the transistor 32a, a base terminal is connected to the an terminal 17b, the collector terminal is connected to the emitter terminals of the transistors 31a and 31b, and an emitter terminal is grounded.

In the transistor 32b, a base terminal is connected to the ap terminal 17a, the collector terminal is connected to the emitter terminals of the transistors 31c and 31d, and an emitter terminal is grounded.

Next, the operation of the image rejection mixer 1 illustrated in FIG. 2 will be described.

When an IF signal_normal phase $\cos(\omega_1 t)$ is input from the IF input/output terminal 11a, the distribution circuit 14 divides the IF signal_normal phase $\cos(\omega_1 t)$ into two.

Then, the distribution circuit 14 outputs one of the divided IF signals_normal phase $\cos(\omega_1 t)$ to the delay element 15a, and outputs the other one of the divided IF signals_normal phase $\cos(\omega_1 t)$ to the an terminal 17b of the second mixing circuit 17.

When an IF signal_reversed phase $-\cos(\omega_1 t)$ is input from the IF input/output terminal 11b, the distribution circuit 14 divides the IF signal_reversed phase $-\cos(\omega_1 t)$ into two.

Then, the distribution circuit 14 outputs one of the divided IF signals_reversed phase $-\cos(\omega_1 t)$ to the delay element 15a, and outputs the other one of the divided IF signals_reversed phase $-\cos(\omega_1 t)$ to the ap terminal 17a of the second mixing circuit 17.

When the IF signal_normal phase $\cos(\omega_1 t)$ is received from the distribution circuit 14, the delay element 15a delays the IF signal_normal phase $\cos(\omega_1 t)$ by the delay amount d, and outputs the delayed IF signal_normal phase $\cos(\omega_1 t+d)$ to the ap terminal 16a of the first mixing circuit 16.

Moreover, when the IF signal_reversed phase $-\cos(\omega_1 t)$ from the distribution circuit 14, the delay element 15a delays the IF signal_reversed phase $-\cos(\omega_1 t)$ by the delay amount d, and outputs the delayed IF signal_reversed phase $-\cos(\omega_1 t+d)$ to the an terminal 16b of the first mixing circuit 16.

The delay element 15b delays an LO signal_normal phase $\cos(\omega_2 t)$ input from the LO input terminal 12a by the delay amount d, and outputs the delayed LO signal_normal phase $\cos(\omega_2 t+d)$ to the bn terminal 17d of the second mixing circuit 17.

The delay element 15b also delays an LO signal_reversed phase $-\cos(\omega_2 t)$ input from the LO input terminal 12b by the delay amount d, and outputs the delayed LO signal_reversed phase $-\cos(\omega_2 t+d)$ to the bp terminal 17c of the second mixing circuit 17.

The first mixing circuit 16 includes the transistors 21a to 21d and the transistors 22a and 22b, and each of the base terminals of the transistors 21a and 21d is input with the IF signal_normal phase cos (ω₁t+d) output from the delay element 15a.

Each of the base terminals of the transistor 21b and the transistor 21c is input with the IF signal_reversed phase −cos (ω₁t+d) output from the delay element 15a.

The base terminal of the transistor 22a is input with the LO signal_normal phase cos (ω₂t) input from the LO input terminal 12a.

The base terminal of the transistor 22b is input with the LO signal_reversed phase −cos (ω₂t) input from the LO input terminal 12b.

The second mixing circuit 17 includes the transistors 31a to 31d and the transistors 32a and 32b, and the base terminal of the transistor 32a is input with the IF signal_normal phase cos (ω₁t) input from the IF input/output terminal 11a.

The base terminal of the transistor 32b is input with the IF signal_reversed phase −cos (ω₁t) input from the IF input/output terminal 11b.

The LO signal_normal phase cos (ω₂t+d) output from the delay element 15b is input to each of the base terminals of the transistor 31a and the transistor 31d.

Each of the base terminals of the transistor 31b and the transistor 31c is input with the LO signal_reversed phase −cos (ω₂t+d) output from the delay element 15b.

Therefore, the current $I_1$ shown below flows through the collector terminal of the transistor 21a connected with the cp terminal 16e, and the current $I_3$ shown below flows through the collector terminal of the transistor 21c connected with the cp terminal 16e.

The current $I_2$ shown below flows through the collector terminal of the transistor 21b connected with the cn terminal 16f, and the current $I_4$ shown below flows through the collector terminal of the transistor 21d connected with the cn terminal 16f.

In addition, the current $I_5$ shown below flows through the collector terminal of the transistor 31a connected with the cn terminal 17f, and the current $I_7$ shown below flows through the collector terminal of the transistor 31c connected with the cn terminal 17f.

The current $I_6$ shown below flows through the collector terminal of the transistor 31b connected with the cp terminal 17e, and the following current $I_8$ shown below flows through the collector terminal of the transistor 31d connected with the cp terminal 17e.

$$I_1 = \sum_{n=1}^{\infty} g_n(\cos(\omega_1 t + d) - A\cos(\omega_2 t))^n$$

$$I_2 = \sum_{n=1}^{\infty} g_n(-\cos(\omega_1 t + d) - A\cos(\omega_2 t))^n$$

$$I_3 = \sum_{n=1}^{\infty} g_n(-\cos(\omega_1 t + d) + A\cos(\omega_2 t))^n$$

$$I_4 = \sum_{n=1}^{\infty} g_n(\cos(\omega_1 t + d) + A\cos(\omega_2 t))^n$$

$$I_5 = \sum_{n=1}^{\infty} g_n(\cos(\omega_2 t + d) - A\cos(\omega_1 t))^n$$

$$I_6 = \sum_{n=1}^{\infty} g_n(-\cos(\omega_2 t + d) - A\cos(\omega_1 t))^n$$

$$I_7 = \sum_{n=1}^{\infty} g_n(-\cos(\omega_2 t + d) + A\cos(\omega_1 t))^n$$

$$I_8 = \sum_{n=1}^{\infty} g_n(\cos(\omega_2 t + d) + A\cos(\omega_1 t))^n \quad (1)$$

In equations (1), $g_n$ denotes the transconductance of each of the transistors 21a to 21d and 31a to 31d. The symbol n corresponds to the order of each signal and is an integer.

The symbol A denotes the voltage gain of each of the transistors 22a, 22b, 32a, and 32b.

The term ±A cos ω$_x$t (x=1, 2) represents the emitter voltage of each of the transistors.

Each of the first mixing circuit 16 and the second mixing circuit 17 is a Gilbert cell, and since the Gilbert cell is a double balanced mixer, the signals each output from the cp terminal 16e and the cn terminal 16f can be considered by a differential signal.

Likewise, the signals each output from the cp terminal 17e and the cn terminal 17f can be considered by a differential signal.

Therefore, where n=2 in equations (1), the currents $I_1$ to $I_8$ are expressed as $(a \pm b)^2$, and the squared components $(=a^2+b^2)$ of $(a \pm b)^2$ are canceled, and thus it suffices to consider only the term ±2ab for the currents $I_1$ to $I_8$.

The terms ±2ab of the currents $I_1$ to $I_8$ are represented by the following equations (2).

$$I_1 \approx -2A \cos(\omega_1 t+d) \cdot \cos(\omega_2 t)$$

$$I_2 \approx 2A \cos(\omega_1 t+d) \cdot \cos(\omega_2 t)$$

$$I_3 \approx -2A \cos(\omega_1 t+d) \cdot \cos(\omega_2 t)$$

$$I_4 \approx 2A \cos(\omega_1 t+d) \cdot \cos(\omega_2 t)$$

$$I_5 \approx -2A \cos(\omega_2 t+d) \cdot \cos(\omega_1 t)$$

$$I_6 \approx 2A \cos(\omega_2 t+d) \cdot \cos(\omega_1 t)$$

$$I_7 \approx -2A \cos(\omega_2 t+d) \cdot \cos(\omega_1 t)$$

$$I_8 \approx 2A \cos(\omega_2 t+d) \cdot \cos(\omega_1 t) \quad (2)$$

The combining circuit 18 combines the RF signal_normal phase output from the first mixing circuit 16 and the RF signal_normal phase output from the second mixing circuit 17, and outputs the combined RF signal_normal phase to the RF input/output terminal 13a.

The combining circuit 18 also combines the RF signal_reversed phase output from the first mixing circuit 16 and the RF signal_reversed phase output from the second mixing circuit 17, and outputs the combined RF signal_reversed phase to the RF input/output terminal 13b.

The RF signal_normal phase output from the combining circuit 18 to the RF input/output terminal 13a and the RF signal_reversed phase output from the combining circuit 18 to the RF input/output terminal 13b are expressed by the following equations (3).

RF signal_normal phase=OUT_$P=I_1+I_3+I_6+I_8$

RF signal_reversed phase=OUT_$N=I_2+I_4+I_5+I_7$ (3)

Furthermore, the current $I_1+I_3+I_6+I_8$ output from the RF input/output terminal 13a and the current $I_2+I_4+I_5+I_7$ output from the RF input/output terminal 13b are expressed by the following equations (4).

$$OUT\_P = I_1 + I_3 + I_6 + I_8 \quad (4)$$
$$= -2A\cos(\omega_1 t + d) \cdot \cos(\omega_2 t) - 2A\cos(\omega_1 t + d) \cdot$$
$$\cos(\omega_2 t) + 2A\cos(\omega_2 t + d) \cdot \cos(\omega_1 t) +$$
$$2A\cos(\omega_2 t + d) \cdot \cos(\omega_1 t)$$
$$= -4A\{\cos(\omega_1 t + d) \cdot \cos(\omega_2 t) - \cos(\omega_2 t + d) \cdot$$
$$\cos(\omega_1 t)\}$$

$$OUT\_N = I_2 + I_4 + I_5 + I_7$$
$$= 2A\cos(\omega_1 t + d) \cdot \cos(\omega_2 t) + 2A\cos(\omega_1 t + d) \cdot$$
$$\cos(\omega_2 t) - 2A\cos(\omega_2 t + d) \cdot \cos(\omega_1 t) -$$
$$2A\cos(\omega_2 t + d) \cdot \cos(\omega_1 t)$$
$$= 4A\{\cos(\omega_1 t + d) \cdot \cos(\omega_2 t) - \cos(\omega_2 t + d) \cdot$$
$$\cos(\omega_1 t)\}$$

A differential component (OUT_P−OUT_N) between the current $I_1+I_3+I_6+I_8$ output from the RF input/output terminal 13a and the current $I_2+I_4+I_5+I_7$ output from the RF input/output terminal 13b is expressed by the following equation (5).

$$OUT\_P - OUT\_N = -8A\{\cos(\omega_1 t + d) \cdot \cos(\omega_2 t) - \quad (5)$$
$$\cos(\omega_2 t + d) \cdot \cos(\omega_1 t)$$
$$= -4A[\cos\{(\omega_1 + \omega_2)t + d\} +$$
$$\cos\{(\omega_1 - \omega_2)t + d\} -$$
$$\{\cos\{(\omega_1 + \omega_2)t + d\} -$$
$$\cos\{(\omega_1 - \omega_2)t + d\}\}]$$
$$= -4A\{\cos\{(\omega_1 - \omega_2)t + d\} -$$
$$\cos\{(\omega_1 - \omega_2)t - d\}\}$$
$$= 8A\sin(\omega_1 - \omega_2)t \cdot \sin(d)$$

In the image rejection mixer 1, the RF signal_normal phase output from the RF input/output terminal 13a and the RF signal_reversed phase output from the RF input/output terminal 13b are obtained as output signals.

In the image rejection mixer 1, therefore, by using the difference between the RF signal_normal phase output from the RF input/output terminal 13a and the RF signal_reversed phase output from the RF input/output terminal 13b, the differential component (OUT_P−OUT_N) can be obtained as the desired signal.

The differential component (OUT_P−OUT_N) has a value corresponding to the delay amount d of the delay elements 15a and 15b as illustrated in equation (5).

Although the image rejection mixer 1 that obtains the differential component (OUT_P−OUT_N) as the desired signal is illustrated here, the image rejection mixer 1 may obtain a value obtained by dividing the differential component (OUT_P−OUT_N) by sin (d) as a desired signal. For example, if a division processing unit that divides the differential component (OUT_P−OUT_N) by sin (d) is connected to the RF input/output terminals 13a and 13b, the image rejection mixer 1 can obtain the value obtained by dividing the differential component (OUT_P−OUT_N) by sin (d).

At this point, the signal output from the image rejection mixer 1 is only the desired signal, and no unwanted signals are output such as a sum frequency component ($\omega_1+\omega_2$).

In the image rejection mixer 1, a desired signal can be obtained even in a case where the delay amount d is not a value corresponding to, for example, a phase shift amount of 90 degrees. That is, the image rejection mixer 1 can obtain a desired signal without being affected by the setting accuracy of the delay amount d.

Note that in a case where the delay amount d is 0 degrees or 180 degrees, the differential component (OUT_P−OUT_N) becomes zero, and thus 0 degrees nor 180 degrees cannot be used as the delay amount d.

In the image rejection mixer 1 illustrated in FIG. 2, an example is illustrated in which each of the first mixing circuit 16 and the second mixing circuit 17 is a Gilbert cell; however, it is not limited thereto.

Each of the first mixing circuit 16 and the second mixing circuit 17 is only required to have a function of multiplying, and may be, for example, a switching mixer.

Figure 4A:
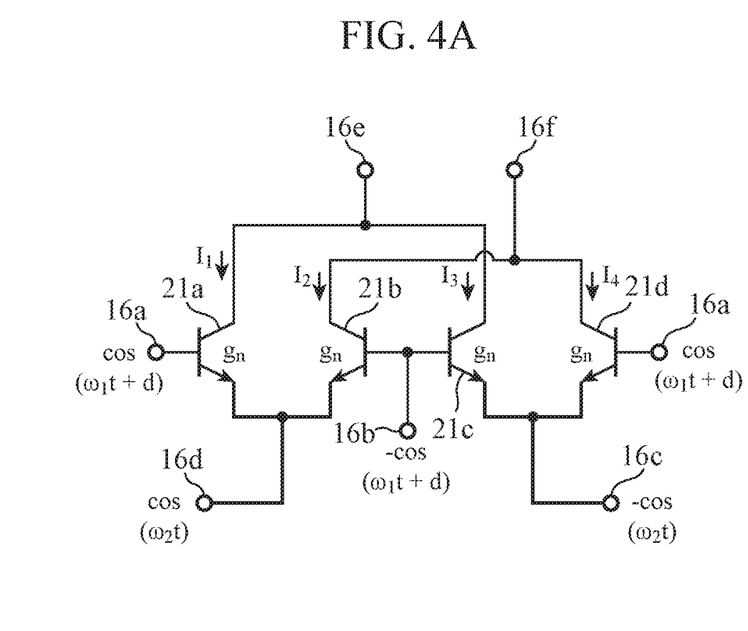
FIG. 4A is a configuration diagram illustrating a first mixing circuit 16 in a case where the first mixing circuit 16 is a switching mixer.
Figure 4B:
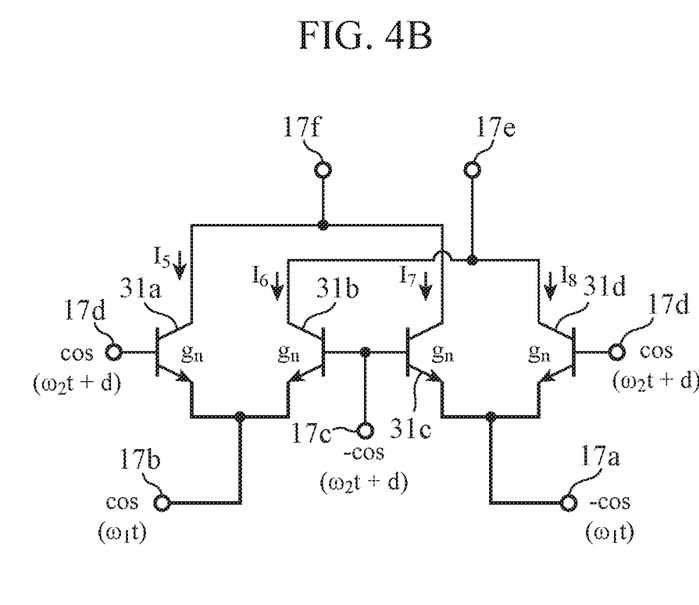
FIG. 4B is a configuration diagram illustrating a second mixing circuit 17 in a case where the second mixing circuit 17 is a switching mixer.

FIG. 4A is a configuration diagram illustrating a first mixing circuit 16 in a case where the first mixing circuit 16 is a switching mixer, and FIG. 4B is a configuration diagram illustrating the second mixing circuit 17 in a case where the second mixing circuit 17 is a switching mixer.

The first mixing circuit 16 illustrated in FIG. 4A does not include the transistors 22a and 22b included in the first mixing circuit 16 illustrated in FIG. 3A.

In the first mixing circuit 16 illustrated in FIG. 4A, the bn terminal 16d is connected to the emitter terminals of transistors 21a and 21b, and the bp terminal 16c is connected to the emitter terminals of the transistors 21c and 21d.

The second mixing circuit 17 illustrated in FIG. 4B does not include the transistors 32a and 32b included in the second mixing circuit 17 illustrated in FIG. 3B.

In the second mixing circuit 17 illustrated in FIG. 4B, the an terminal 17b is connected to the emitter terminals of the transistors 31a and 31b, and the ap terminal 17a is connected to the emitter terminals of the transistors 31c and 31d.

In the image rejection mixer 1 illustrated in FIG. 2, an example is illustrated in which the delay element 15a is connected between the distribution circuit 14 and the first mixing circuit 16, and the delay element 15b is connected between the LO input terminals 12a and 12b and the second mixing circuit 17; however, it is not limited thereto.

Figure 5:
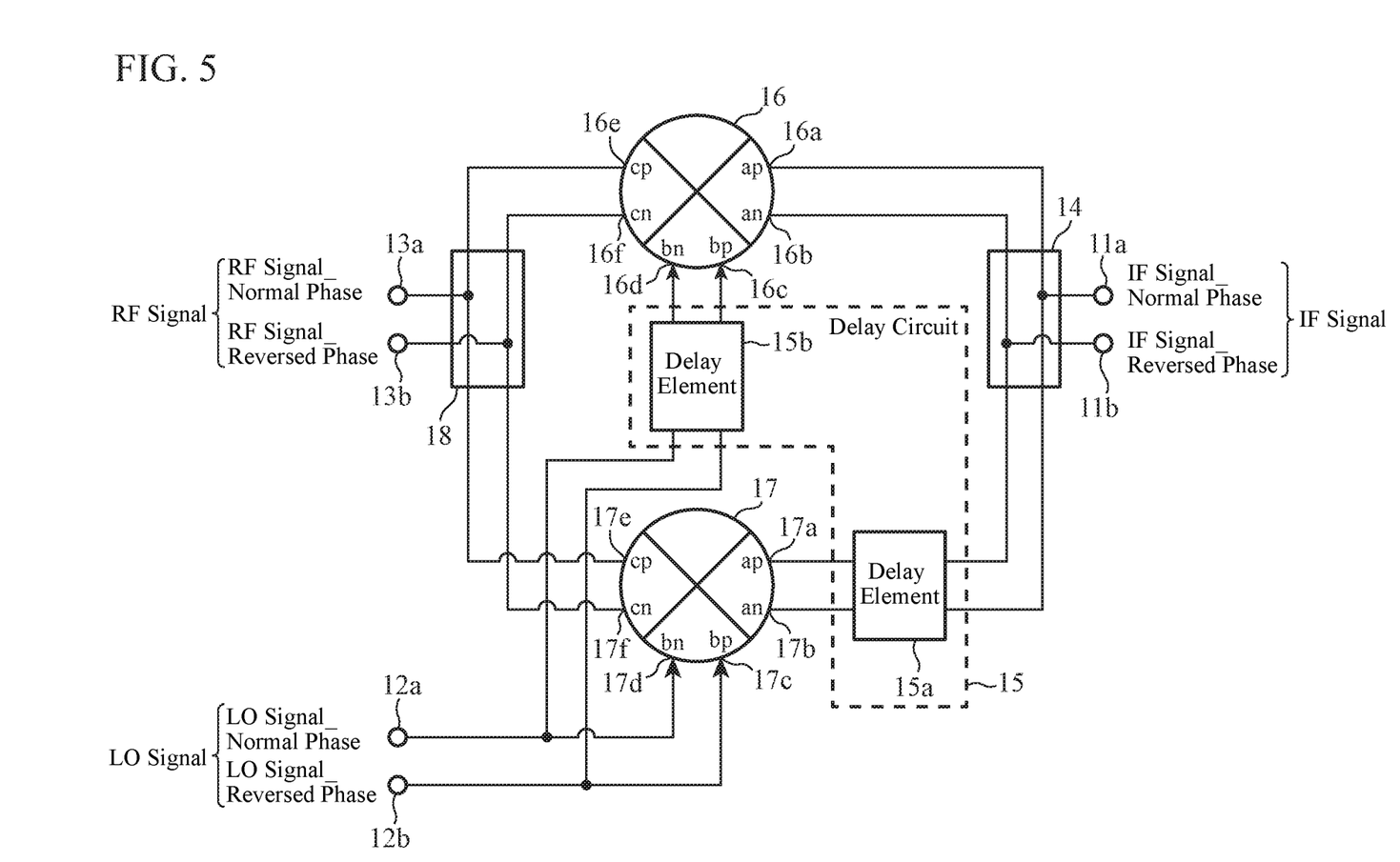
FIG. 5 is a configuration diagram illustrating another image rejection mixer 1 according to the first embodiment.

For example, as illustrated in FIG. 5, in an image rejection mixer 1, the delay element 15a may be connected between the distribution circuit 14 and the second mixing circuit 17, and the delay element 15b may be connected between the LO input terminals 12a and 12b and the first mixing circuit 16.

FIG. 5 is a configuration diagram illustrating another image rejection mixer 1 according to the first embodiment.

The image rejection mixer 1 illustrated in FIG. 2 illustrates an example in which each of the IF signal_normal phase and the IF signal_reversed phase is input as the first signal; however, each of an RF signal_normal phase and an RF signal_reversed phase may be input as a first signal.

Figure 6:
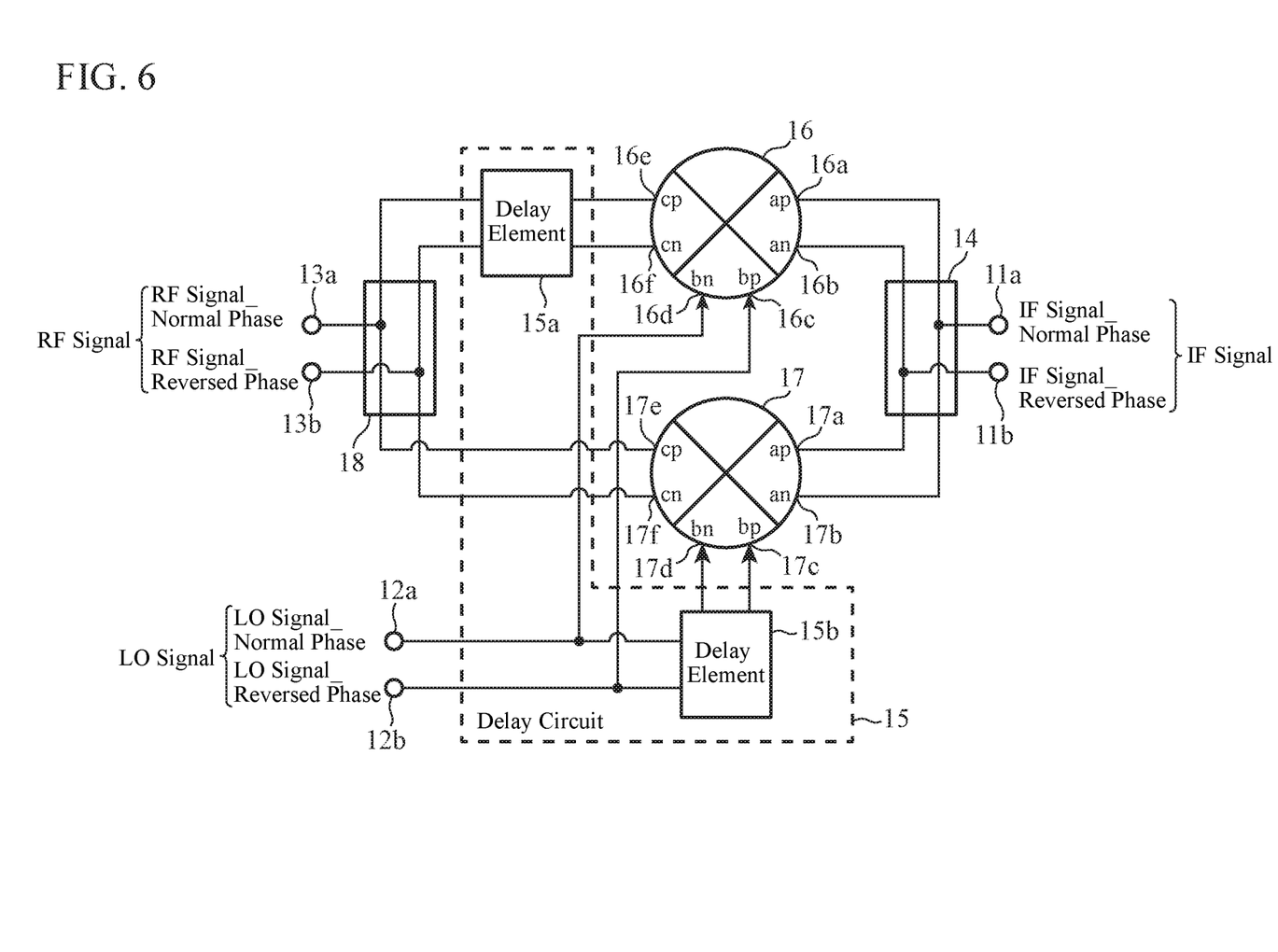
FIG. 6 is a configuration diagram illustrating still another image rejection mixer 1 according to the first embodiment.
Figure 7:
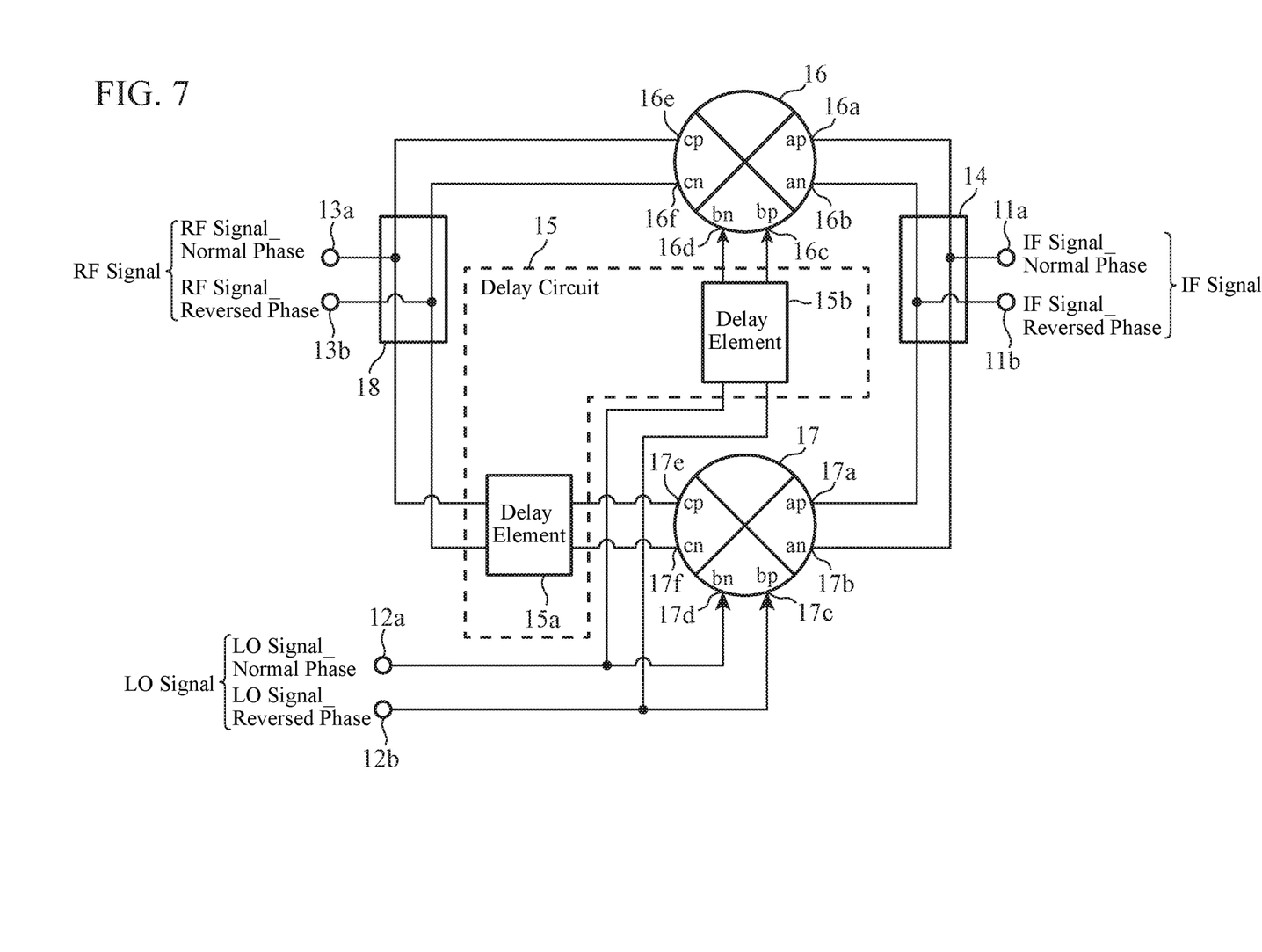
FIG. 7 is a configuration diagram illustrating yet another image rejection mixer 1 according to the first embodiment.

Image rejection mixers 1 to which an RF signal_normal phase and an RF signal_reversed phase are input as the first signal are configured as illustrated in FIG. 6 or FIG. 7.

FIG. 6 and FIG. 7 are configuration diagrams illustrating still other image rejection mixers 1 according to the first embodiment.

In the image rejection mixers 1 illustrated in FIG. 6 and FIG. 7, an IF signal_normal phase is output from an IF input/output terminal 11a, and an IF signal_reversed phase is output from an IF input/output terminal 11b.

In the image rejection mixers 1 illustrated in FIG. 6 and FIG. 7, the distribution circuit 14 is used as a combining circuit, and the combining circuit 18 is used as a distribution circuit.

In the image rejection mixer 1 illustrated in FIG. 6, a delay element 15a is connected between the combining circuit 18 and a first mixing circuit 16, and a delay element 15b is connected between LO input terminals 12a and 12b and a second mixing circuit 17.

In the image rejection mixer 1 illustrated in FIG. 7, a delay element 15a is connected between the combining circuit 18 and a second mixing circuit 17, and a delay element 15b is connected between LO input terminals 12a and 12b and a first mixing circuit 16.

In the first embodiment, the image rejection mixer 1 includes the delay circuit 15 delaying the one of the first signals divided by the differential distribution circuit 14 and the other one of the second signals provided to the second differential mixing circuit 17 by the same delay amount, or delaying the other one of the first signals divided by the differential distribution circuit 14 and the one of the second signals provided to the first differential mixing circuit 16 by the same delay amount d. Therefore, the image rejection mixer 1 can suppress frequency components other than the desired signal.

Second Embodiment

Figure 8A:
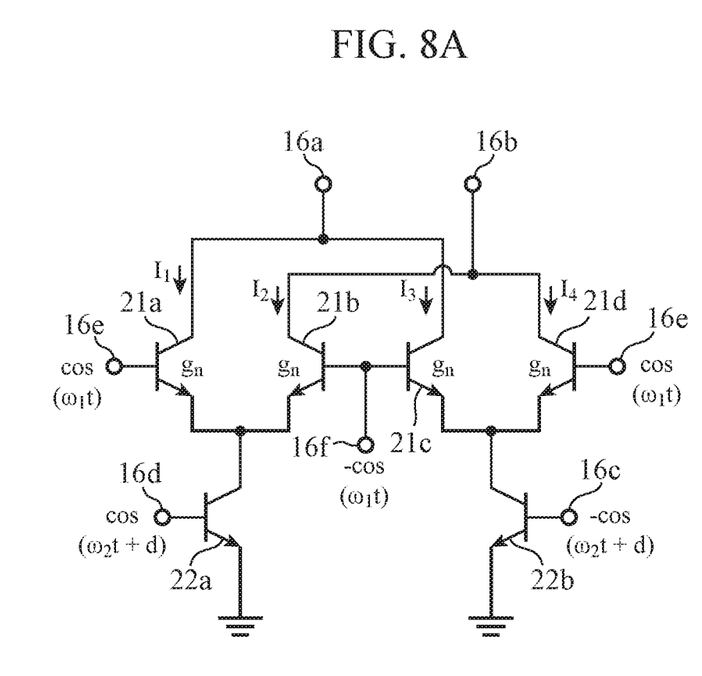
FIG. 8A is a configuration diagram illustrating a first mixing circuit 16 in a case where the first mixing circuit 16 is a Gilbert cell.
Figure 8B:
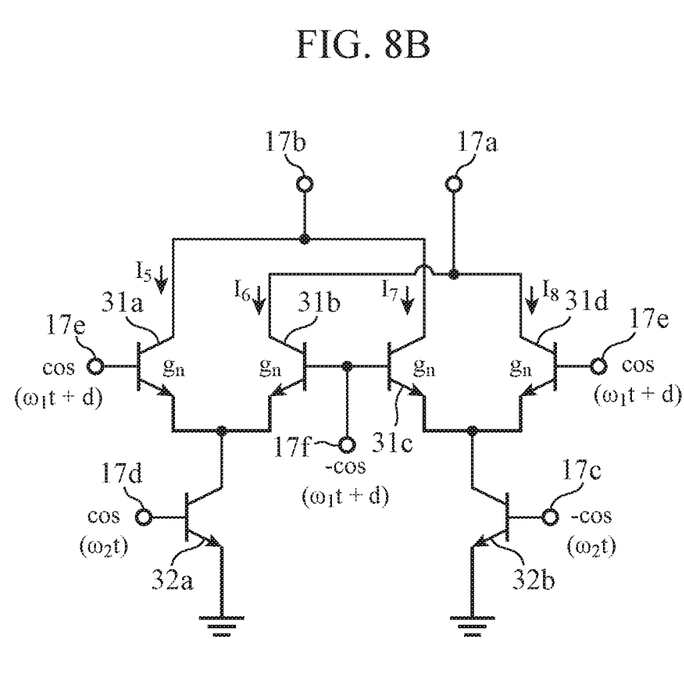
FIG. 8B is a configuration diagram illustrating a second mixing circuit 17 in a case where the second mixing circuit 17 is a Gilbert cell.

In the image rejection mixer 1 illustrated in FIG. 7, a configuration diagram illustrating the first mixing circuit 16 is illustrated in FIG. 8A, and a configuration diagram illustrating the second mixing circuit 17 is illustrated in FIG. 8B.

The amplitude of each of the LO signal_normal phase cos ($\omega_2 t$) and the LO signal_reversed phase $-\cos(\omega_2 t)$ can be determined at the time of designing the communication circuit using the image rejection mixer 1. The LO signal_normal phase cos ($\omega_2 t$) and the LO signal_reversed phase $-\cos(\omega_2 t)$ both have a substantially constant amplitude.

However, in a case where each of an RF signal_normal phase cos ($\omega_1 t$) and an RF signal_reversed phase $-\cos(\omega_1 t)$ is a reception signal, for example, the amplitude of each of the RF signal_normal phase cos ($\omega_1 t$) and the RF signal_reversed phase $-\cos(\omega_1 t)$ are determined by the signal level of the reception signal.

Therefore, in the first mixing circuit 16, there are cases where a gain error occurs between the gains of the transistors 21a to 21d and the gains of the transistors 22a and 22b depending on the signal level of the reception signals.

Furthermore, in the second mixing circuit 17, there are cases where a gain error occurs between the gains in the transistors 31a to 31d and the gains in the transistors 32a and 32b depending on the signal level of the reception signals.

In the first mixing circuit 16 illustrated in FIG. 8A, an LO signal (LO signal_normal phase or LO signal_reversed phase) is input to a base terminal of each of the transistors 21a to 21d (hereinafter referred to as the "upper transistors").

In the first mixing circuit 16 illustrated in FIG. 8A, an RF signal (RF signal_normal phase or RF signal_reversed phase) is input to a base terminal of each of the transistors 22a and 22b (hereinafter referred to as the "lower transistors").

If an RF signal is input to base terminals of the upper transistors and an LO signal is input to the base terminals of the lower transistors, there are cases where switching of the upper transistors becomes disabled when a gain error occurs.

In the first mixing circuit 16 illustrated in FIG. 8A, however, an LO signal is input to the base terminals of the upper transistors, and an RF signal is input to the base terminals of the lower transistors. Therefore, switching of the upper transistors can be performed even if a gain error occurs.

In the second mixing circuit 17 illustrated in FIG. 8B, an LO signal (LO signal_normal phase or LO signal_reversed phase) is input to a base terminal of each of the transistors 31a to 31d (hereinafter referred to as the "upper transistors").

In the second mixing circuit 17 illustrated in FIG. 8B, an RF signal (RF signal_normal phase or RF signal_reversed phase) is input to a base terminal of each of the transistors 32a and 32b (hereinafter referred to as the "lower transistors").

If an RF signal is input to base terminals of the upper transistors and an LO signal is input to the base terminals of the lower transistors, there are cases where switching of the upper transistors becomes disabled when a gain error occurs. In the second mixing circuit 17 illustrated in FIG. 8B, however, an LO signal is input to the base terminals of the upper transistors, and an RF signal is input to the base terminals of the lower transistors. Therefore, switching of the upper transistors can be performed even if a gain error occurs.

Third Embodiment

In a third embodiment, it is assumed that, in the image rejection mixer 1 illustrated in FIG. 2, input signals of the IF input/output terminals 11a and 11b and input signals of the LO input terminals 12a and 12b have the same frequency $\omega$ and phases that are different from each other. The phase difference between the phase of the input signals of the IF input/output terminals 11a and 11b and the phase of the input signals of the LO input terminals 12a and 12b is $\varphi$.

The input signal of the IF input/output terminal 11a is the IF signal_normal phase cos ($\omega t + \varphi$), and the input signal of the IF input/output terminal 11b is IF signal_reversed phase $-\cos(\omega t + \varphi)$.

The input signal of the LO input terminal 12a is LO signal_normal phase cos ($\omega t$), and the input signal of the LO input terminal 12b is LO signal_reversed phase $-\cos(\omega t)$.

Figure 9A:
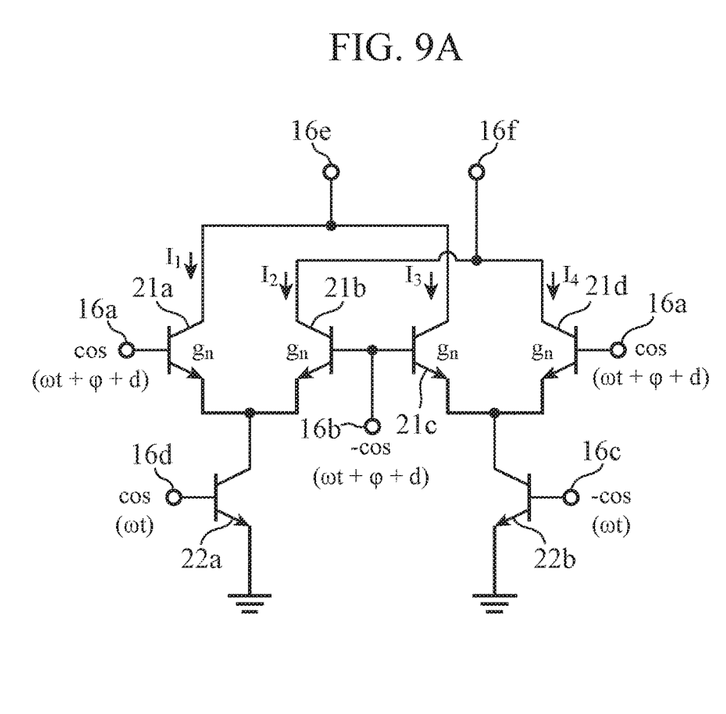
FIG. 9A is a configuration diagram illustrating a first mixing circuit 16 in a case where the first mixing circuit 16 is a Gilbert cell.
Figure 9B:
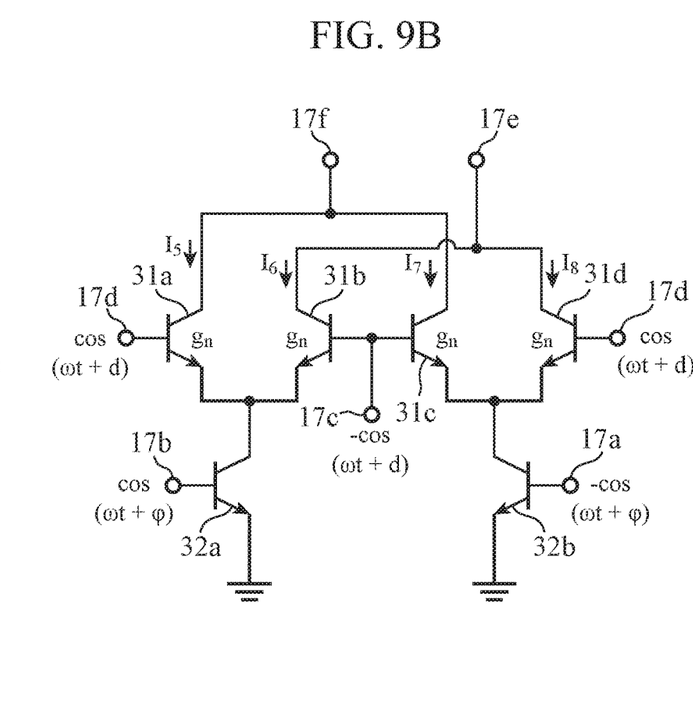
FIG. 9B is a configuration diagram illustrating a second mixing circuit 17 in a case where the second mixing circuit 17 is a Gilbert cell.

FIG. 9A is a configuration diagram illustrating a first mixing circuit 16 in a case where the first mixing circuit 16 is a Gilbert cell, and FIG. 9B is a configuration diagram illustrating a second mixing circuit 17 in a case where the second mixing circuit 17 is a Gilbert cell.

In the first mixing circuit 16 illustrated in FIG. 9A, currents $I_1$ to $I_8$ are represented by the following equations (6).

$$I_1 = \sum_{n=1}^{\infty} g_n (\cos(\omega t + \varphi + d) - A\cos(\omega t))^n \quad (6)$$

$$I_2 = \sum_{n=1}^{\infty} g_n (-\cos(\omega t + \varphi + d) - A\cos(\omega t))^n$$

$$I_3 = \sum_{n=1}^{\infty} g_n (-\cos(\omega t + \varphi + d) + A\cos(\omega t))^n$$

$$I_4 = \sum_{n=1}^{\infty} g_n (\cos(\omega t + \varphi + d) + A\cos(\omega t))^n$$

$$I_5 = \sum_{n=1}^{\infty} g_n(\cos(\omega t + d) - A\cos(\omega t + \varphi))^n$$

$$I_6 = \sum_{n=1}^{\infty} g_n(-\cos(\omega t + d) - A\cos(\omega t + \varphi))^n$$

$$I_7 = \sum_{n=1}^{\infty} g_n(-\cos(\omega t + d) + A\cos(\omega t + \varphi))^n$$

$$I_8 = \sum_{n=1}^{\infty} g_n(\cos(\omega t + d) + A\cos(\omega t + \varphi))^n$$

The terms ±2ab of the currents $I_1$ to $I_8$ are represented by the following equations (7).

$$I_1 \approx -2A\cos(\omega t + \varphi + d)\cdot\cos(\omega t)$$

$$I_2 \approx 2A\cos(\omega t + \varphi + d)\cdot\cos(\omega t)$$

$$I_3 \approx -2A\cos(\omega t + \varphi + d)\cdot\cos(\omega t)$$

$$I_4 \approx 2A\cos(\omega t + \varphi + d)\cdot\cos(\omega t)$$

$$I_5 \approx -2A\cos(\omega t + d)\cdot\cos(\omega t + \varphi)$$

$$I_6 \approx 2A\cos(\omega t + d)\cdot\cos(\omega t + \varphi)$$

$$I_7 \approx -2A\cos(\omega t + d)\cdot\cos(\omega t + \varphi)$$

$$I_8 \approx 2A\cos(\omega t + d)\cdot\cos(\omega t + \varphi) \quad (7)$$

The RF signal_normal phase output from the combining circuit 18 to the RF input/output terminal 13a and the RF signal_reversed phase output from the combining circuit 18 to the RF input/output terminal 13b are expressed by the following equations (8).

RF signal_normal phase=OUT_P=$I_1+I_3+I_6+I_8$

RF signal_reversed phase=OUT_P=$I_2+I_4+I_5+I_7$ (8)

Furthermore, the current $I_1+I_3+I_6+I_8$ output from the RF input/output terminal 13a and the current $I_2+I_4+I_5+I_7$ output from the RF input/output terminal 13b are expressed by the following equations (9).

$$\begin{aligned}
\text{OUT\_P} &= I_1 + I_3 + I_6 + I_8 \quad (9)\\
&= -2A\cos(\omega t + \varphi + d)\cdot\cos(\omega t) - 2A\cos(\omega t + \varphi + d)\cdot\\
&\quad \cos(\omega t) + 2A\cos(\omega t + d)\cdot\cos(\omega t + \varphi) +\\
&\quad 2A\cos(\omega t + d)\cdot\cos(\omega t + \varphi)\\
&= -4A\{\cos(\omega t + \varphi + d)\cdot\cos(\omega t) - \cos(\omega t + d)\cdot\\
&\quad \cos(\omega t + \varphi)\}
\end{aligned}$$

$$\begin{aligned}
\text{OUT\_N} &= I_2 + I_4 + I_5 + I_7\\
&= 2A\cos(\omega t + \varphi + d)\cdot\cos(\omega t) + 2A\cos(\omega t + \varphi + d)\cdot\\
&\quad \cos(\omega t) - 2A\cos(\omega t + d)\cdot\cos(\omega t + \varphi) -\\
&\quad 2A\cos(\omega t + d)\cdot\cos(\omega t + \varphi)\\
&= 4A\{\cos(\omega t + \varphi + d)\cdot\cos(\omega t) - \cos(\omega t + d)\cdot\\
&\quad \cos(\omega t + \varphi)\}
\end{aligned}$$

A differential component (OUT_P−OUT_N) between the current $I_1+I_3+I_6+I_8$ output from the RF input/output terminal 13a and the current $I_2+I_4+I_5+I_7$ output from the RF input/output terminal 13b is expressed by the following equation (10).

$$\begin{aligned}
\text{OUT\_P} - \text{OUT\_N} &= -8A\{\cos(\omega t + \varphi + d)\cdot\cos(\omega t) - \quad (10)\\
&\quad \cos(\omega t + d)\cdot\cos(\omega t + \varphi)\}\\
&= -4A\{\cos(2\omega t + \varphi + d) + \cos(\varphi + d) -\\
&\quad \cos(2\omega t + \varphi + d) - \cos(\varphi - d)\}\\
&= -4A\{\cos(\varphi + d) - \cos(\varphi - d)\}\\
&= -4A\{\cos(\varphi)\cos(d) - \sin(\varphi)\sin(d) -\\
&\quad (\cos(\varphi)\cos(d) + \sin(\varphi)\sin(d))\}\\
&= 8A\sin(d)\sin(\varphi)
\end{aligned}$$

In the image rejection mixer 1, the RF signal_normal phase output from the RF input/output terminal 13a and the RF signal_reversed phase output from the RF input/output terminal 13b are obtained as output signals.

In the image rejection mixer 1, therefore, by using the difference between the RF signal_normal phase output from the RF input/output terminal 13a and the RF signal_reversed phase output from the RF input/output terminal 13b, the differential component (OUT_P−OUT_N) can be obtained as the desired signal.

The differential component (OUT_P−OUT_N) has a value corresponding to the delay amount d of the delay elements 15a and 15b as expressed in equation (10).

Although the image rejection mixer 1 that obtains the differential component (OUT_P−OUT_N) as the desired signal is illustrated here, the image rejection mixer 1 may obtain a value obtained by dividing the differential component (OUT_P−OUT_N) by sin (d) as a desired signal. For example, if a division processing unit that divides the differential component (OUT_P−OUT_N) by sin (d) is connected to the RF input/output terminals 13a and 13b, the image rejection mixer 1 can obtain the value obtained by dividing the differential component (OUT_P−OUT_N) by sin (d).

At this point, the signal output from the image rejection mixer 1 is only the desired signal, and no unwanted signals are output such as a sum frequency component ($\omega_1+\omega_2$).

Moreover, in the image rejection mixer 1, a signal containing a DC component that is directly proportional to the value of the sine function whose argument is the phase difference φ is obtained from equation (10). Normally, in a case where a mixer detects a phase, a signal containing a DC component that is directly proportional to a value of a cosine function is obtained. Therefore, in order to obtain a signal containing a DC component that is directly proportional to a value of a sine function, a 90-degree phase shifter needs be mounted in the mixer. However, since a signal containing a DC component that is directly proportional to the value of the sine function can be obtained in the image rejection mixer 1, there is no need to mount a 90-degree phase shifter.

Furthermore, since second order harmonic components are canceled in the differential component (OUT_P−OUT_N), there is no need to mount a filter for removing the second harmonic components.

In the third embodiment, the image rejection mixer 1 illustrated in FIG. 2 has been described; however, for example, the image rejection mixer 1 illustrated in FIG. 5 may be used.

The image rejection mixer 1 illustrated in FIG. 2 illustrates an example in which each of the IF signal_normal phase and the IF signal_reversed phase is input as the first signal; however, each of an RF signal_normal phase and an RF signal_reversed phase may be input as a first signal.

Image rejection mixers 1 to which an RF signal_normal phase and an RF signal_reversed phase are input as the first signal are configured as illustrated in FIG. 6 or FIG. 7.

Note that the present invention may include a flexible combination of the embodiments, a modification of any component of the embodiments, or an omission of any component in the embodiments within the scope of the present invention.

INDUSTRIAL APPLICABILITY

The present invention is suitable for an image rejection mixer including first and second mixing circuits.

The present invention is also suitable for a communication circuit including an image rejection mixer.

REFERENCE SIGNS LIST

1: image rejection mixer, 2: amplifier, 3: antenna, 11a: IF input/output terminal, 11b: IF input/output terminal, 12a: LO input terminal, 12b: LO input terminal, 13a: RF input/output terminal, 13b: RF input/output terminal, 14: distribution circuit, 15: delay circuit, 15a, 15b: delay element, 16: first mixing circuit, 16a: ap terminal, 16b: an terminal, 16c: bp terminal, 16d: bn terminal, 16e: cp terminal, 16f: cn terminal, 17: second mixing circuit, 17a: ap terminal, 17b: an terminal, 17c: bp terminal, 17d: bn terminal, 17e: cp terminal, 17f: cn terminal, 18: combining circuit, 21a to 21d: transistor, 22a, 22b: transistor, 31a to 31d: transistor, 32a, 32b: transistor

The invention claimed is:

1. An image rejection mixer comprising:
a differential distribution circuit dividing a first signal into two first signals;
a first differential mixing circuit mixing one of the first signals divided by the differential distribution circuit and one of second signals and outputting third differential signals indicating a result of mixing the one of the first signals and the one of the second signals;
a second differential mixing circuit mixing another one of the first signals divided by the differential distribution circuit and another one of the second signals and outputting fourth differential signals indicating a result of mixing the other one of the first signals and the other one of the second signals;
a combining circuit combining a third signal among the third differential signals output by the first differential mixing circuit and a fourth signal among the fourth differential signals output by the second differential mixing circuit, the third signal and the fourth signal having signs opposite to each other, respectively; and
a delay circuit delaying the one of the first signals divided by the differential distribution circuit and the other one of the second signals provided to the second differential mixing circuit by a same delay amount, or delaying the other one of the first signals divided by the differential distribution circuit and the one of the second signals provided to the first differential mixing circuit by a same delay amount,
wherein each of the differential distribution circuit, the first differential mixing circuit, the second differential mixing circuit, the combining circuit, and the delay circuit has a differential configuration
wherein the first signal to be divided by the differential distribution circuit and the one of the second signals before the delaying by the delay circuit and the other one of the second signals before the delaying by the delay circuit have a same frequency and phases that are different from each other, and
a differential component of the signal combined by the combining circuit includes a direct current component that is directly proportional to a value of a sine function whose argument is a difference between a phase of the first signal and a phase of the second signal.

* * * * *